(12) United States Patent
Gee et al.

(10) Patent No.: US 8,199,447 B2
(45) Date of Patent: Jun. 12, 2012

(54) MONOLITHIC MULTI-CHANNEL ESD PROTECTION DEVICE

(75) Inventors: Harry Gee, Sunnyvale, CA (US);
Wenjiang Zeng, Sunnyvale, CA (US);
Jeffrey C. Dunnihoo, Bertram, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 350 days.

(21) Appl. No.: 12/651,902

(22) Filed: Jan. 4, 2010

(65) Prior Publication Data
US 2011/0163352 A1      Jul. 7, 2011

(51) Int. Cl.
*H02H 9/00*      (2006.01)
(52) U.S. Cl. .......................................... 361/56
(58) Field of Classification Search ...................... 361/56
See application file for complete search history.

(56) References Cited

U.S. PATENT DOCUMENTS

| | | | |
|---|---|---|---|
| 5,290,724 A * | 3/1994 | Leach | 438/234 |
| 5,500,546 A | 3/1996 | Marum et al. | |
| 5,510,947 A * | 4/1996 | Pellegrini et al. | 361/56 |
| 5,578,860 A * | 11/1996 | Costa et al. | 257/528 |
| 5,668,384 A * | 9/1997 | Murakami | 257/106 |
| 5,780,905 A * | 7/1998 | Chen et al. | 257/355 |

OTHER PUBLICATIONS

Maxim Integrated Products, "Dual, Quad, and Hex High-Speed Differential ESD-Protection ICs", Mar. 2005, pp. 1-13, Sunnyvale, CA.
Maxim Integrated Products, "HFTA-16.0: ESD Protection for Bipolar Integrated Circuits", Apr. 5, 2007, pp. 1-8, Sunnyvale, CA.

* cited by examiner

*Primary Examiner* — Stephen W Jackson
(74) *Attorney, Agent, or Firm* — Pillsbury Winthrop Shaw Pittman LLP

(57) ABSTRACT

A semiconductor device is described that includes one or more electrostatic discharge (ESD) protection circuits. Each circuit comprises reverse-biased steering diodes connected in series between power rail and signal ground, a bypass Zener diode and a substrate Zener diode. The Zener diodes provide ESD protection and the steering diode cooperate with the substrate Zener diode to provide a bypass function that is substantially symmetric about the signal ground. Noise in the circuit can be shunted using internal and/or external capacitances that can be implemented as Zener diodes.

19 Claims, 9 Drawing Sheets

2 Steering diodes with 2 Zeners
Lightly doped substrate

2 Steering diodes with 2 Zeners
Heavy P+ substrate and P-Epi

2 Steering Diodes with 1 Zener under the Top Steering Diode

MONOLITHIC MULTI-CHANNEL ESD PROTECTION DEVICE

BACKGROUND OF THE INVENTION

1. Field of the Invention

The present invention relates generally to electrostatic discharge protection of integrated circuits.

2. Description of Related Art

An integrated circuit (IC) connected to external ports is susceptible to damaging electrostatic discharge (ESD) pulses from the operating environment and peripherals. The same ever-shrinking IC process technology that enables such high-port interconnect data rates can also suffer from higher ESD susceptibility because of its smaller fabrication geometry. Additional external protection devices can violate stringent signaling requirements, leaving design engineers with the need to balance performance and reliability.

The changing application environment is also contributing to increased ESD vulnerability. A proliferation of laptop computers and handheld devices such as cell phones, personal digital assistants (PDAs), and other mobile devices are being used in uncontrolled environments (i.e., no wrist-grounding straps or conductive and grounded table surfaces). In these environments, people are likely to touch I/O connector pins during the connecting and disconnecting of cables.

Conventional methods of shunting ESD energy to protect ICs involves devices such as Zener diodes, metal oxide varistors (MOVs), transient voltage suppression (TVS) diodes, and regular complementary metal oxide semiconductor (CMOS) or bipolar clamp diodes. However, at the much higher data rates of USB 2.0, IEEE 1394, and digital visual interface (DVI), the parasitic impedance of traditional protection devices can distort and deteriorate signal integrity.

FIG. 1 shows a configuration of diodes used to protect multiple signals. Diodes 12 are used to clamp a number of signals 14 to a power rail 100, while diodes 16 clamp the signals 14 to ground 102. A Zener diode 18 provides over-voltage discharge protection between power 100 and ground 102. As can be seen in the characteristic 140, voltage swings are clamped such that negative signal swing is limited to one diode drop. Although, larger negative swings can be obtained by using one of the channels as ground as shown in FIG. 2, this approach results in high crosstalk between channels due to the resultant high impedance to ground pin.

Moreover, conventional transient voltage suppressors are fabricated using processes that do not permit customization or significant alteration of Zener breakdown voltage. A conventional back-to-back transient voltage suppressor may have a performance specification in which the forward and backward breakdown voltages are non-symmetrical and difficult to change within the confines of the technology used in that product. Moreover, the failure of conventional devices to provide symmetry limits applicability in many applications. Generally, the symmetry and breakdown voltages of devices in conventional systems may be altered only at the cost of increased layout inefficiency efficient.

BRIEF SUMMARY OF THE INVENTION

A semiconductor device according to certain aspects of the invention includes one or more electrostatic discharge (ESD) protection circuits, each comprising a plurality of reverse-biased steering diodes connected in series between a rail and a signal ground clamping input signals to a first clamping voltage level. A bypass Zener diode connected between the rail and the signal ground provides ESD protection for the signal through a low impedance path between the rail and the signal ground that is available when the voltage difference between the rail and the signal ground exceeds a first predetermined threshold level. A substrate Zener diode connected between the signal ground and a substrate of the semiconductor device controls a second clamping voltage of the circuit. The substrate Zener diode provides a low impedance path between the signal ground and the substrate when the voltage difference between the signal ground and the substrate when the voltage difference between signal ground and substrate exceeds a second predetermined threshold level.

A signal applied to an input of the circuit is conducted to a junction at which are connected anode of one, and cathode of another of the plurality of steering diodes. Thus, the voltage of the input port is clamped to clamping voltage levels determined by the first and second predetermined threshold levels, which levels are, in turn, controlled by the configuration and characteristics of the plurality of steering diodes and the substrate Zener diode.

The circuit provides ESD protection for another device connected to the input. The clamping voltage levels include a positive clamping voltage with respect to the signal ground and a negative clamping voltage with respect to the signal ground and ESD protection circuit can be configured to have a substantially symmetric current-voltage characteristic relative to the signal ground.

The semiconductor device can comprise a plurality of ESD protection circuits. The rails of these circuits can be isolated from one another. Likewise, the signal grounds of these circuits can be electrically isolated. Electrical isolation can be obtained using substrate trenches, inductances and resistances. Noise in the circuit can be shunted using internal and/or external capacitances that can be implemented as Zener diodes.

DETAILED DESCRIPTION OF THE INVENTION

Figure 1:
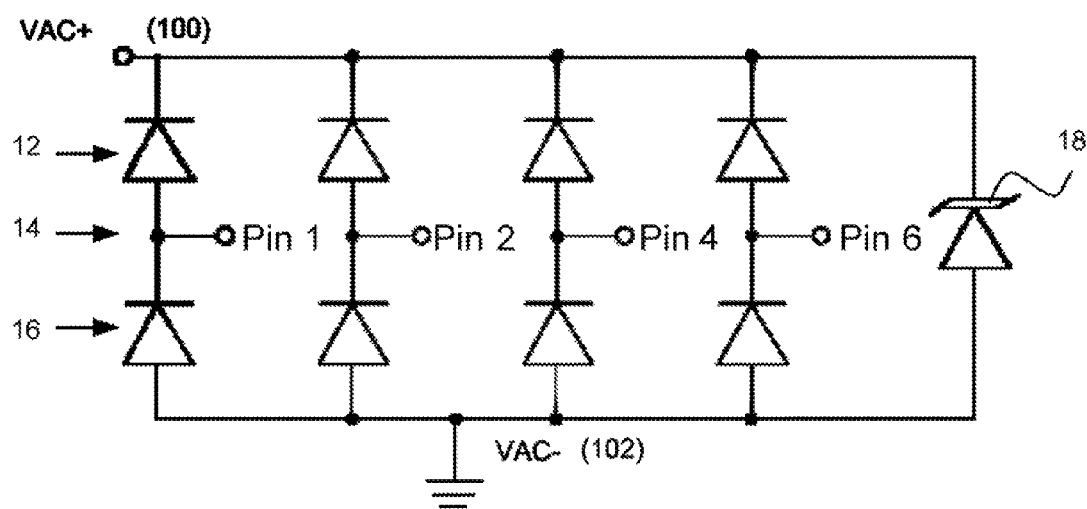
FIG. 1 shows a prior art multi-channel protection circuit with limited negative signal voltage swing.
Figure 1:
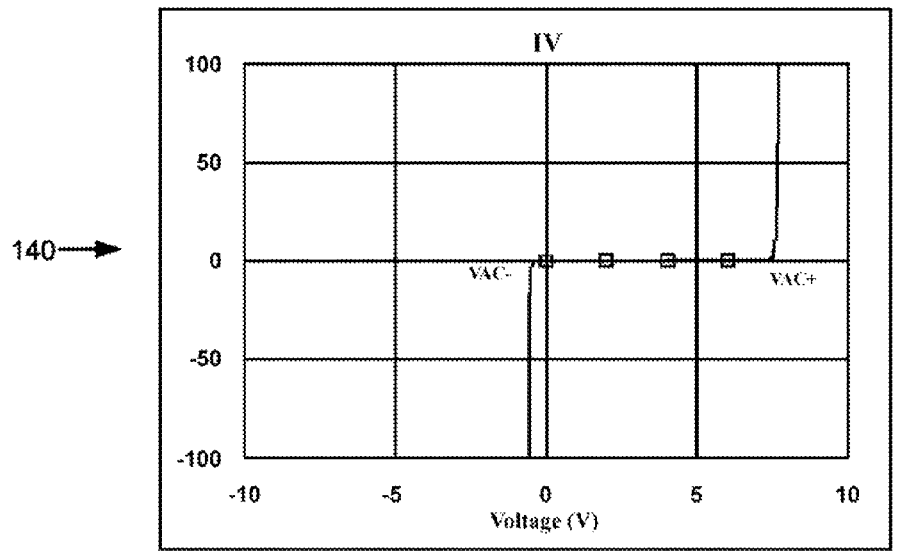
Figure 2:
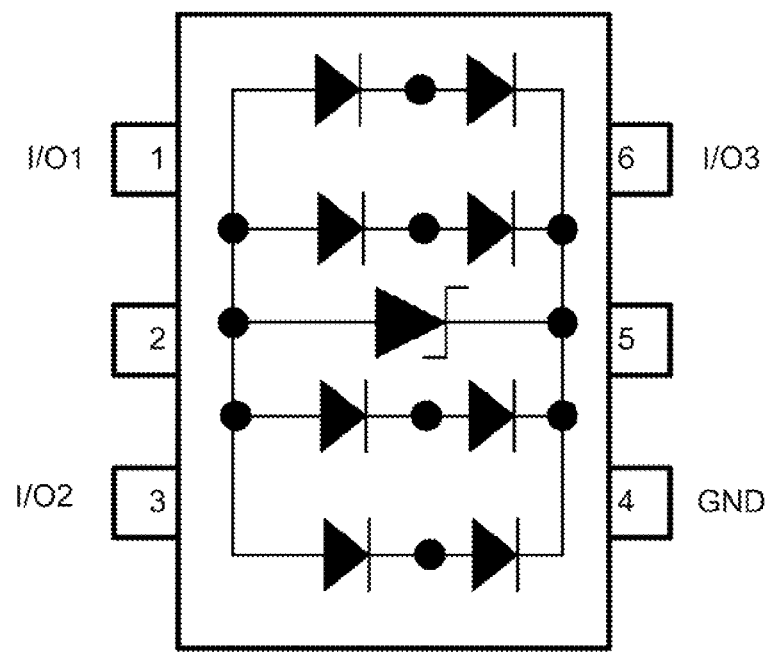
FIG. 2 shows a prior art approach to providing a multi-channel protection circuit with increased negative signal voltage swing.
Figure 2:
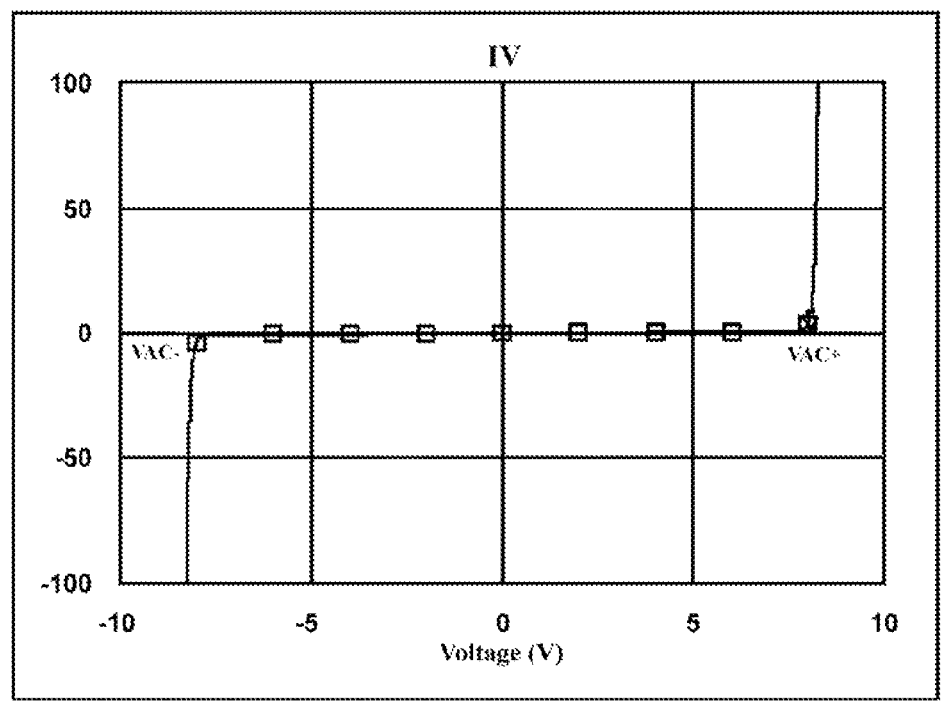

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the components referred to herein by way of illustration.

Certain embodiments of the invention provide advanced protection integrated circuit devices that can be used to prevent damage from environmental electronic hazards in signals that switch, swing or otherwise oscillate about a signal ground, while suppressing cross talk between channels of the device. Environmental electronic hazards include electrostatic discharge ("ESD"), electrical fast transients (EFTs), induced electromagnetic interference (EMI) and lightning strikes that can produce damage and/or system failure. For the purposes of this discussion, reference will be made primarily to ESD events and ESD protection, but the systems and methods described are applicable to a broad range of environmental electronic hazards.

ESD events can involve the transfer of energy between two bodies at different electrostatic potentials, either through contact or an ionized ambient discharge (a spark). ESD protection devices fabricated according to certain aspects of the invention can divert this potentially damaging charge away from sensitive circuitry and protect the system from permanent damage. For example, certain of the devices described below can provide ESD protection for high-frequency input/output (I/O) interconnects, including USB 2.0, Firewire and the like.

FIGS. 3-7 depict examples of ESD protection circuits fabricated according to certain aspects of the invention. These circuits comprise combinations of devices that can include diodes, Zener diodes and capacitors, and which are typically fabricated on a semiconductor substrate 800 (see, for example FIG. 8A). The circuits can support signal voltages 30 and 31 that vary about a signal ground 301. The circuit can be fabricated to handle signals 30 and 31 that have substantially symmetrical positive and negative voltage ranges, although it is contemplated that devices can be fabricated to handle one or more of signals 30 and 31 that have different specified peak voltages for positive and negative swings. Accordingly, circuits according to certain aspects of the invention can be fabricated to protect signals 30 and 31 by limiting signal swings between predetermined positive and negative maximum voltages.

Certain embodiments of the invention are provided on a chip-level component that can be used to protect integrated circuits by connecting transmit and/or receive signals to input 30 or 31. Protection circuits are typically designed to protect a plurality of signals. Examples discussed here are shown as 2-channel (FIGS. 3-6) and 4-channel (FIG. 7) circuits providing connection and protection for 2 or 4 signals respectively. It will be appreciated that the number of channels per device is constrained only by application requirements and packaging constraints. In some embodiments, protection circuits can be provided on dedicated integrated circuits used to protect other integrated circuits. In some embodiments, protection circuits can be provided on an integrated circuit that generates or processes one or more of the protected signals connected to inputs 30 and 31.

Figure 3:
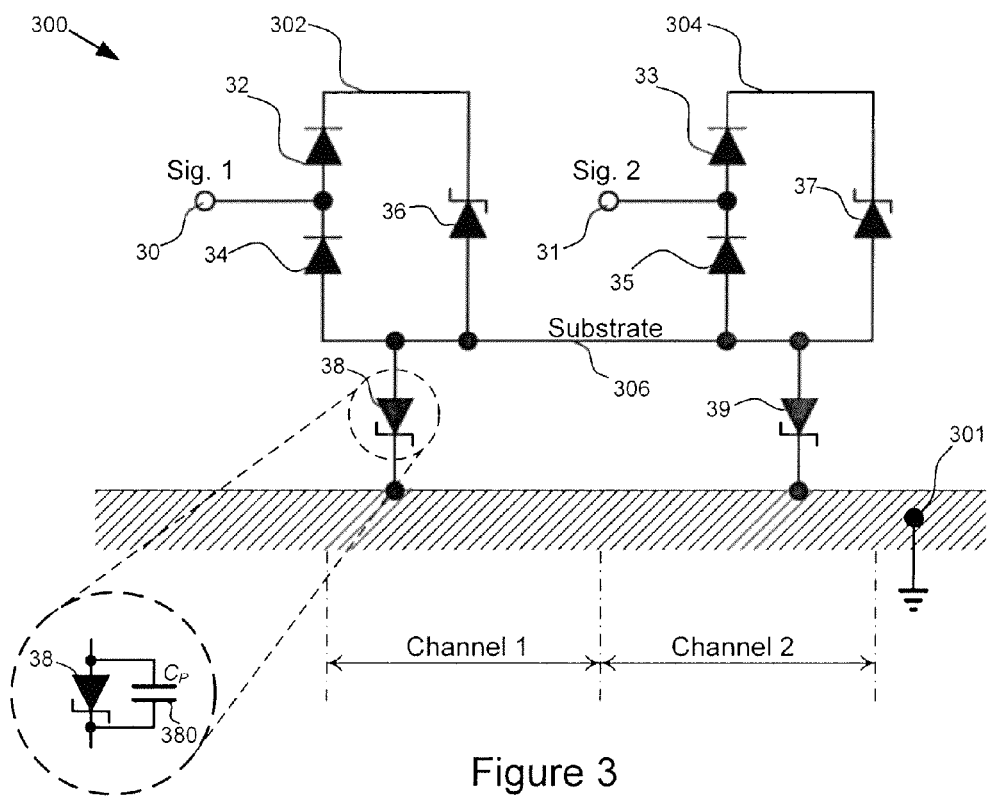
FIG. 3 depicts certain elements of a multi-channel ESD protection circuit fabricated according to certain aspects of the invention.

FIG. 3 is a schematic of an example of a protection circuit 300 according to certain aspects of the invention. Circuit 300 can be fabricated on a semiconductor substrate 800 that may comprise, for example, a silicon wafer, an epitaxial layer, or other suitable semiconductor substrates. Substrate 800 has a potential referred to herein as "substrate 306." Circuit 300 provides multi-channel protection for devices and/or other circuits connected to one of two signals 30 or 31. For the purposes of this discussion, the two channels of the FIG. 3 circuit will be assumed to have nearly identical operational characteristics and specifications.

A signal applied to first input 30 is clamped to rail 302 through steering diode 32 and to substrate 306 through steering diode 34. A signal applied to second input 31 is steered to rail 304 through diode 33 and to ground 301 through the diode 35. In certain embodiments, rail 302 and/or rail 304 may be connected to a power supply, but such connection is optional. In one example, rails 302 and 304 may be fabricated as a connection point for respective diode pairs 32, 36 and 33, 37. In another example, bypass Zener 36 may comprise a plurality of Zener diodes connected in parallel between connecting rail 302 and substrate; such configuration may be used to obtain greater bypass capacitance or current capability. Zener diodes 38 and 39 can be provided between signal ground 301 and substrate 306 and cooperate with Zener diodes 36 and 37 in order to significantly enlarge the signal swing that each channel can handle. The breakdown voltage of Zener diodes 36-39 can be selected to obtain specified positive and negative maximum voltages for inputs 30 and 31. In the example, it will be assumed that Zener diodes 36-39 are fabricated in the same steps of the semiconductor device manufacturing process and, consequently, the breakdown of voltage remains consistent between Zener diodes 36-39.

Input 30 exceeds the specified maximum positive voltage when the voltage across Zener 36 exceeds its breakdown threshold. It will be appreciated that breakdown in Zener 36 occurs when input 30 exceeds the Zener threshold by at least the forward-biased junction voltages of steering diode 32 and Zener 38. Similarly, input 30 exceeds the specified maximum negative voltage when the voltage across Zener 38 exceeds its breakdown threshold. It will be appreciated that breakdown in Zener 38 occurs when input 30 exceeds the Zener threshold by at least the forward-biased junction voltage of steering diode 34. Thus, as depicted, channel 1 of circuit 300 may exhibit a slight asymmetry. In certain embodiments, an additional steering diode may be added between steering diode 34 and substrate to obtain a more symmetrical response (see FIG. 10, as described below).

In circuit 300, rails 302 and 304 are disconnected from one another within the protection circuit to improve suppression of crosstalk between the channels handling signals 30 and 31. However, in some embodiments, rails 302 and 304 may be connected in order to provide increased current capacity through parallel Zeners 36 and 37, for example. In certain embodiments, a single Zener 38 or 39 may be connected between substrate 306 and signal ground 301. However, the provision of separate Zeners 38 and 39 between substrate 306 and signal ground 301 offers certain advantages, particularly with regard to crosstalk. Separate Zeners 38 and 39 may be located in close proximity to corresponding steering diodes 32 and 34 or 33 and 35 and to corresponding Zener diode 36 or 37. Furthermore, it will be appreciated that circuit 300 provides for connection of the anodes of Zener diodes 36-39 and diodes 34 and 35 to a common substrate 306 (see substrate 800 of FIGS. 8A and 8B). However, and as will be discussed later, isolation of portions of the substrate 306 may be desirable in some embodiments to further reduce crosstalk.

In certain embodiments, the structure and dimensions of Zener diodes 36-39 can be selected to optimize performance of circuit 300. For example, the junctions of Zener diodes 36-39 can be fabricated with sufficient capacitance ($C_P$) 380 to serve as a bypass for signal ground 301 to rails 302 and 304 and between signal ground 301 and substrate 306. These bypass paths can significantly reduce noise and crosstalk.

In certain embodiments, Zener diodes need not be assigned to each channel and a smaller number of adequately provisioned Zener diodes 38 or 39 may be provided between signal ground 301 and substrate 306. However, certain advantages accrue from fabricating Zeners 38 and 39 in proximity to each of the channels and, in particular, physically near to the steering circuits handling input signals 30 and 31 respectively. These advantages can include improved frequency response, reduced impedance in the bypass circuit and higher discharge capacity. Furthermore, the lower impedance path obtained from the relatively large capacitance of Zener diodes 36-39 provides good isolation between channels. Consequently, many embodiments of the invention provide plural Zeners 38 and 39 between signal ground 301 and substrate 306. In certain embodiments, design parameters for Zener diodes 36-39 may be selected to obtain a difference in impedance relative to the steering diodes 32-35 that minimizes crosstalk. Typically, the impedance of a Zener diode 36, 37, 38 or 39 is at least ten times (10×) lower than the impedance of each of steering diodes 32-35. It is contemplated that some applications will permit a greater difference in impedance, although some applications may limit the difference in impedance to a smaller differential value.

Figure 4:
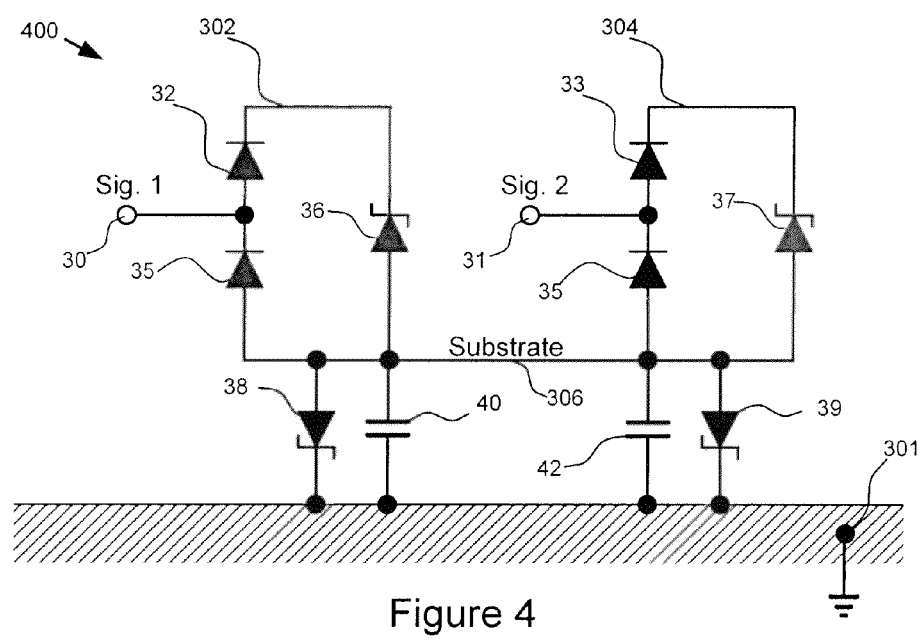
FIG. 4 illustrates an embodiment of the invention with increased crosstalk suppression obtained using additional bypass capacitance.

Turning now to FIG. 4, in certain embodiments a protection circuit 400 includes additional capacitances 40, 42 in parallel with Zener diodes 38 and 39. Additional capacitances 40 and 42 may be fabricated using conventional semiconductor fabrication techniques and may include one or more of a conductive layer, such as a metallization layer separated from another conductive layer by an insulator, a depletion zone created by reverse-biasing a PN junction and external capacitors. It will be appreciated that a reverse biased PN junction is found in a Zener diode (including diodes 36-39). Therefore, many embodiments provide additional capacitance by dedicating additional semiconductor real estate to Zener diodes 36, 37, 38 and 39 and by adding other Zener diodes (not shown) connected in parallel to Zener diodes 36, 37, 38 or 39.

Figure 5:
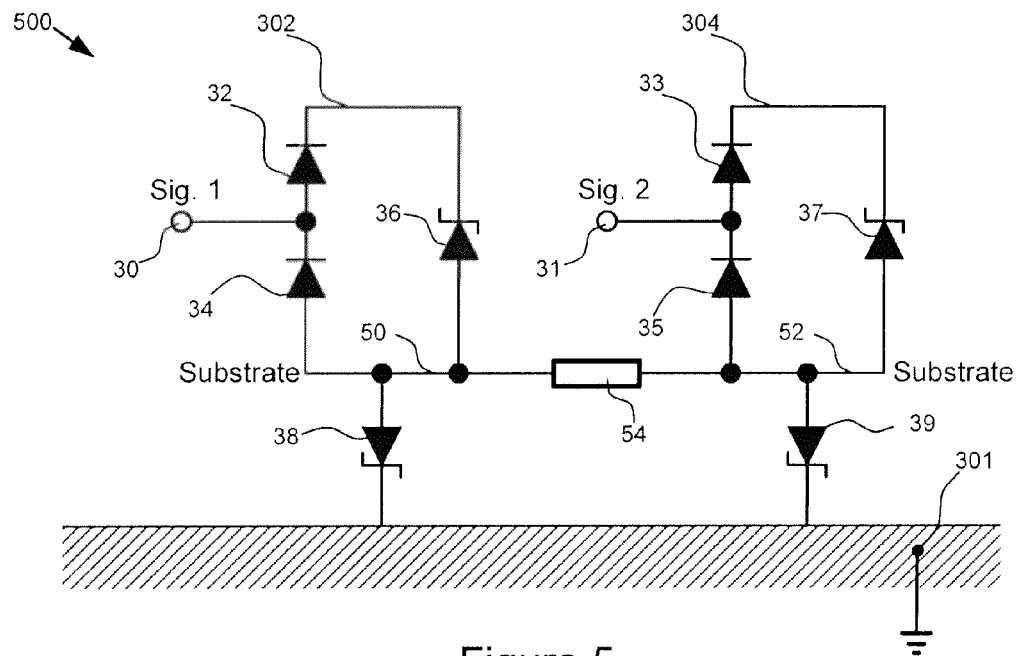
FIG. 5 illustrates an embodiment of the invention with increased crosstalk suppression obtained by signal ground isolation.
Figure 6:
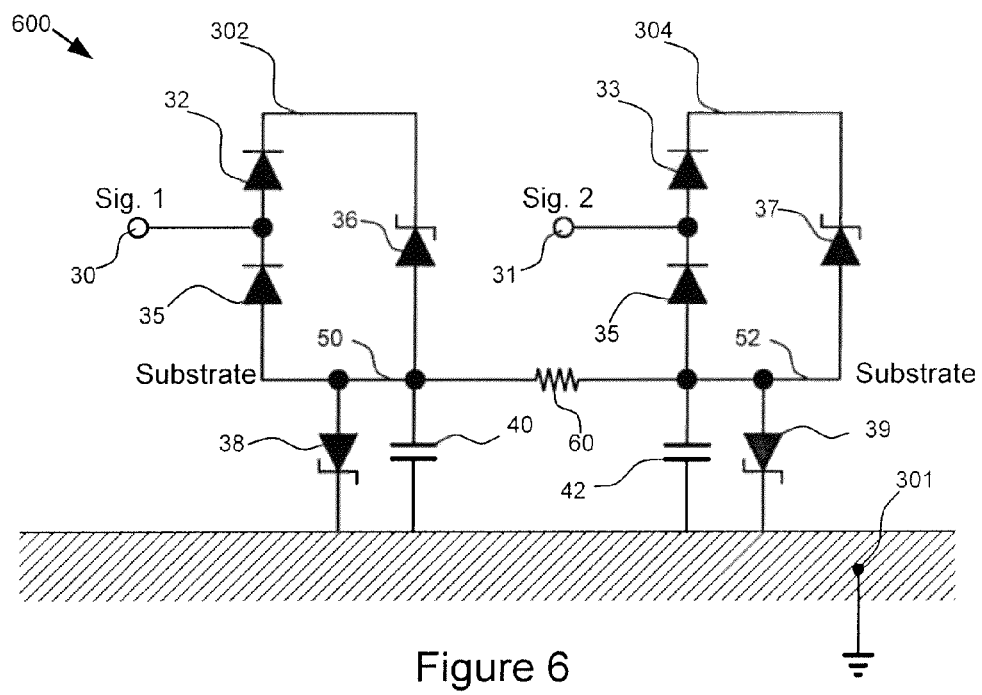
FIG. 6 depicts and embodiment of the invention with increased crosstalk suppression obtained using additional bypass capacitance and signal ground isolation.

Circuits 500 and 600, as illustrated in FIGS. 5 and 6 respectively, differ from circuit 300 of FIG. 3 in the provision of distinct substrate portions 50 and 52 that are coupled by high impedance connection 54, 60 in order to further reduce crosstalk between signal channels. Isolation of distinct substrate portions 50 and 52 from one another can be accomplished using a relatively large impedance, by junction isolation and/or by trench isolation. In one example, isolation may be obtained through the use of semiconductor fabrication technologies such as silicon on sapphire. In another example, isolation may be obtained by fabricating a secondary well inside a deep primary well. Resistive 60 and/or inductive impedances can be employed between isolated substrate portions as desired. Additional capacitances 40 and 42 between signal ground 306 and substrate portions 50 and 52 can reduce crosstalk even further. It will be appreciated that, given sufficient isolation of substrate portions 50 and 52, different operating characteristics can be obtained for each of channels 30 and 31 by, for example, selecting different breakdown voltages for Zener diodes 36 and 38. FIG. 6 depicts an example of a two channel circuit in which both rails 302, 304 and substrate portions 50 and 52 are isolated from one another using a resistive component 60. It is contemplated that isolation elements 54 and 60 may comprise reactive elements, including inductors as desired.

Figure 7:
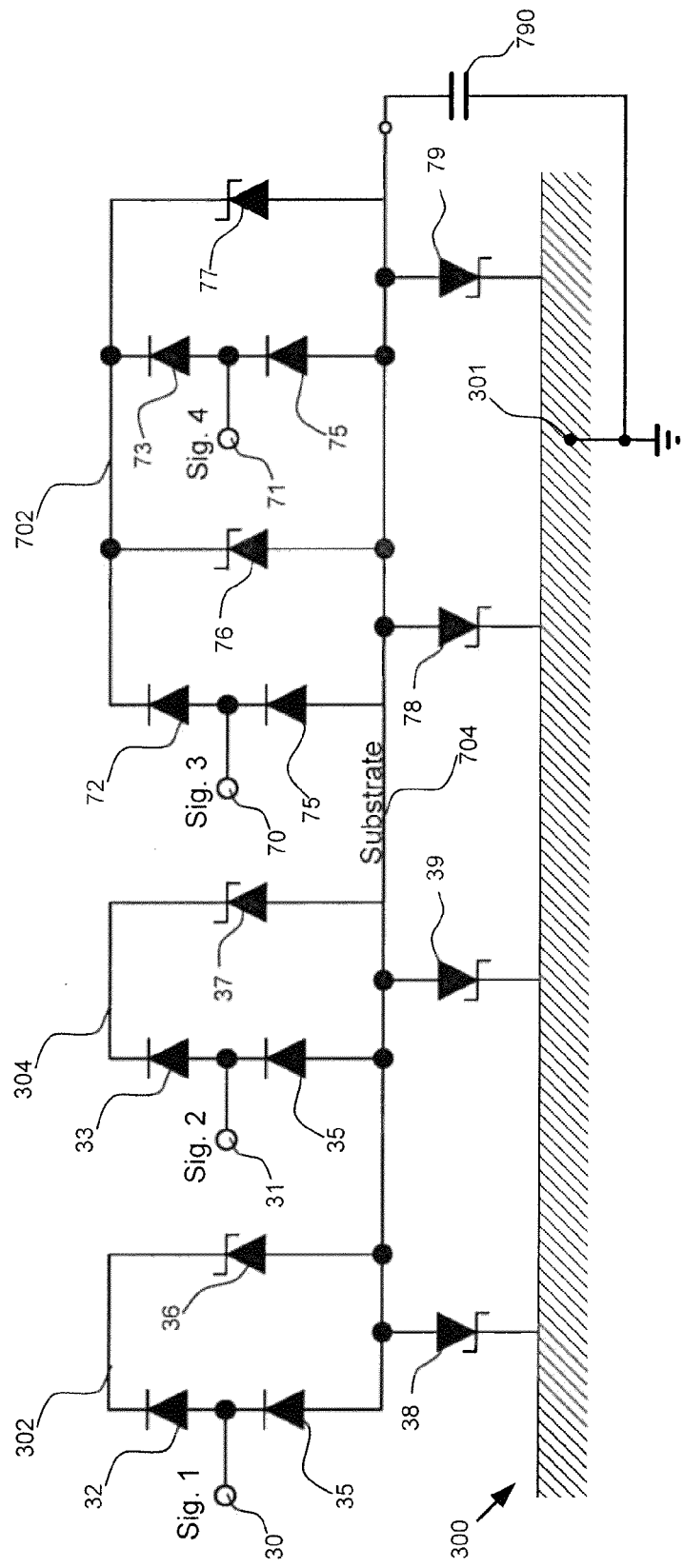
FIG. 7 illustrates certain aspects of the invention associated with a four-channel embodiment of the invention.

FIG. 7 shows an expanded, 4-channel circuit 700 that provides ESD protection for devices connected to signals 30, 31, 70, 71. Channels 70 and 71 share a common rail 702. Furthermore, an external capacitor 790 is provided between substrate 704 and signal ground 301 to further reduce impedance and crosstalk.

As shown by the examples above, certain aspects of the invention provide a monolithic multi-channel ESD protection device for high-speed direct current ("DC") and alternating current ("AC") coupled signals. In normal operation, steering diodes 32 and 35 (for example) have relatively low capacitance, thereby enabling connection of high speed signal lines and providing a best match of line impedance. In certain embodiments, inductances can be added to compensate for capacitive effects on line impedance. Certain embodiments support large signal swings in both positive and negative polarities relative to signal ground which may be connected to a system ground (AC coupled) or to another reference voltage level. Low crosstalk between channels can be achieved and high ESD protection level, equaling or superseding IEC 61000-4-2 level 4 requirements.

Figure 8A:
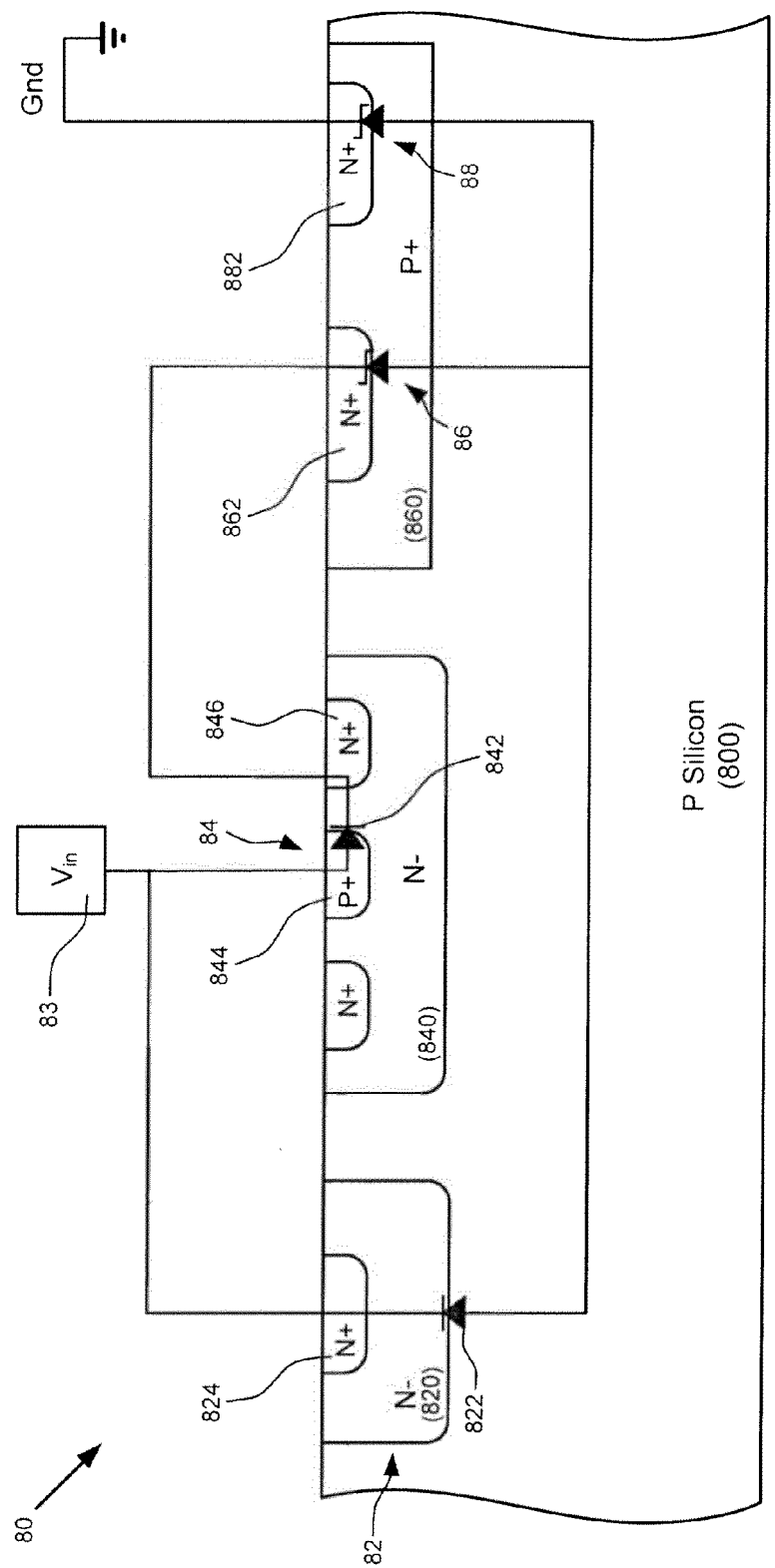
FIGS. 8A and 8B show the general structure of semiconductor integrated circuits which include a circuit according to certain aspects of the invention.
Figure 8B:
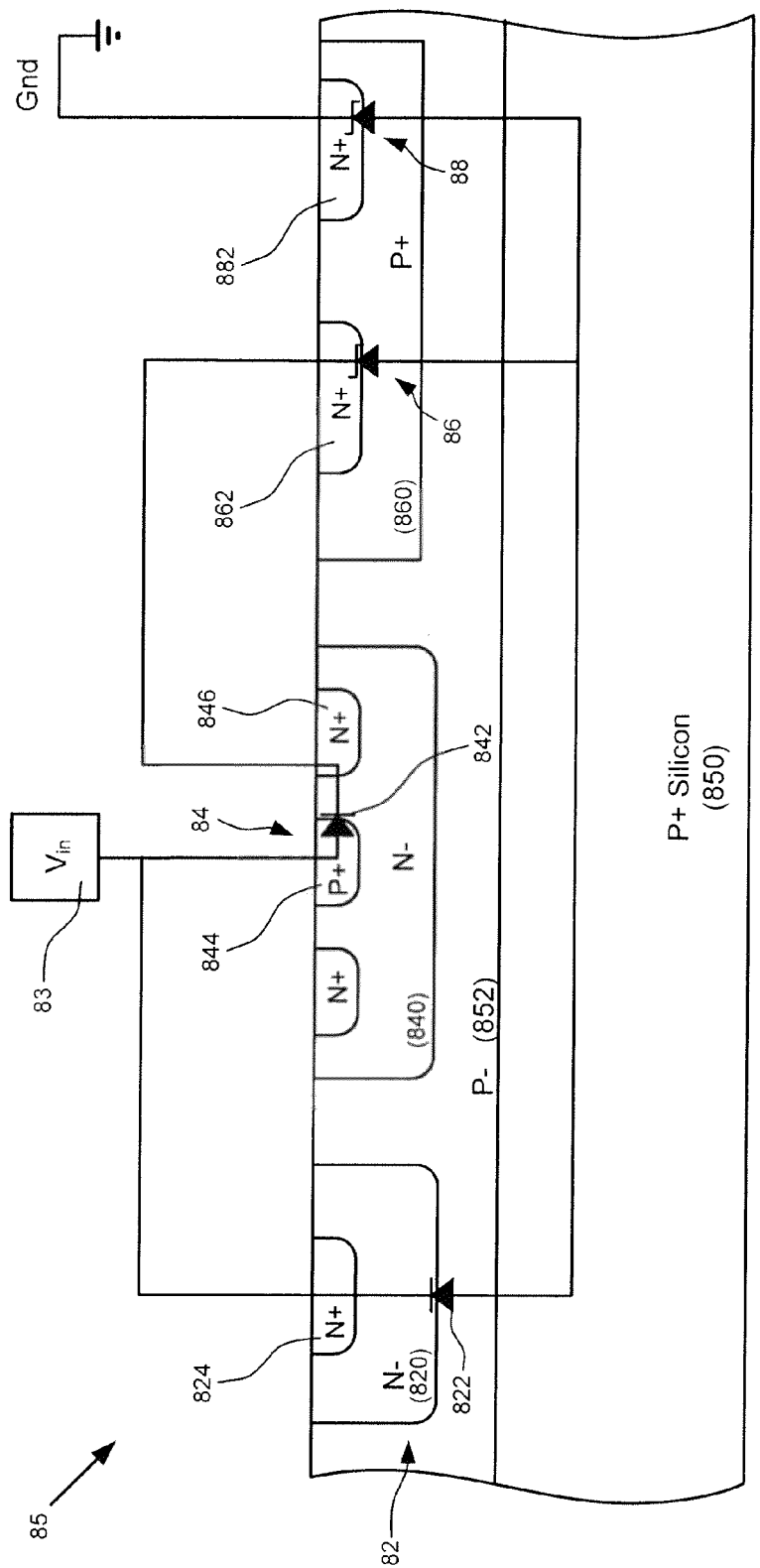

FIGS. 8A and 8B depict examples of semiconductor devices in cross-sectional view and according to certain aspects of the invention. FIGS. 8A and 8B depict circuits 80 and 85 that are implementations of one of the channels shown in FIG. 3. In FIG. 8A, steering diode 82 (schematically, 822) is formed by providing an N− well 820 in a P-type silicon substrate 800. The cathode of diode 82 is connected to input signal 83 through an N+ doped region 824 within N− well 820. A second steering diode 84 (schematically, 842) is formed within a second N− well 840 provided in P-type silicon substrate 800. Diode 84 is formed at the junction of a P+ region 844 within N− well 840. Anode 844 of steering diode 84 is coupled to input signal 83. Cathode of diode 84 is connected through N+ region 846 surrounding P+ region 844 to the cathode 862 of first Zener diode 86, while Anode of diode 82 is coupled to anode of first Zener diode 86 and second Zener diode 88 (through substrate 800). Cathode 882 of second Zener diode 88 is connected to signal ground. Zener diodes 86 and 88 are formed within a P+ well 860 formed in P substrate 800 at the junction of N+ wells 862 and 882. FIG. 8B depicts a circuit 85 having a similar construction as the circuit of FIG. 8A. In FIG. 8B, however, steering diodes 82 and 84 are formed with in a P− epitaxial layer 852 on a heavily doped P+ substrate 850.

Figure 9:
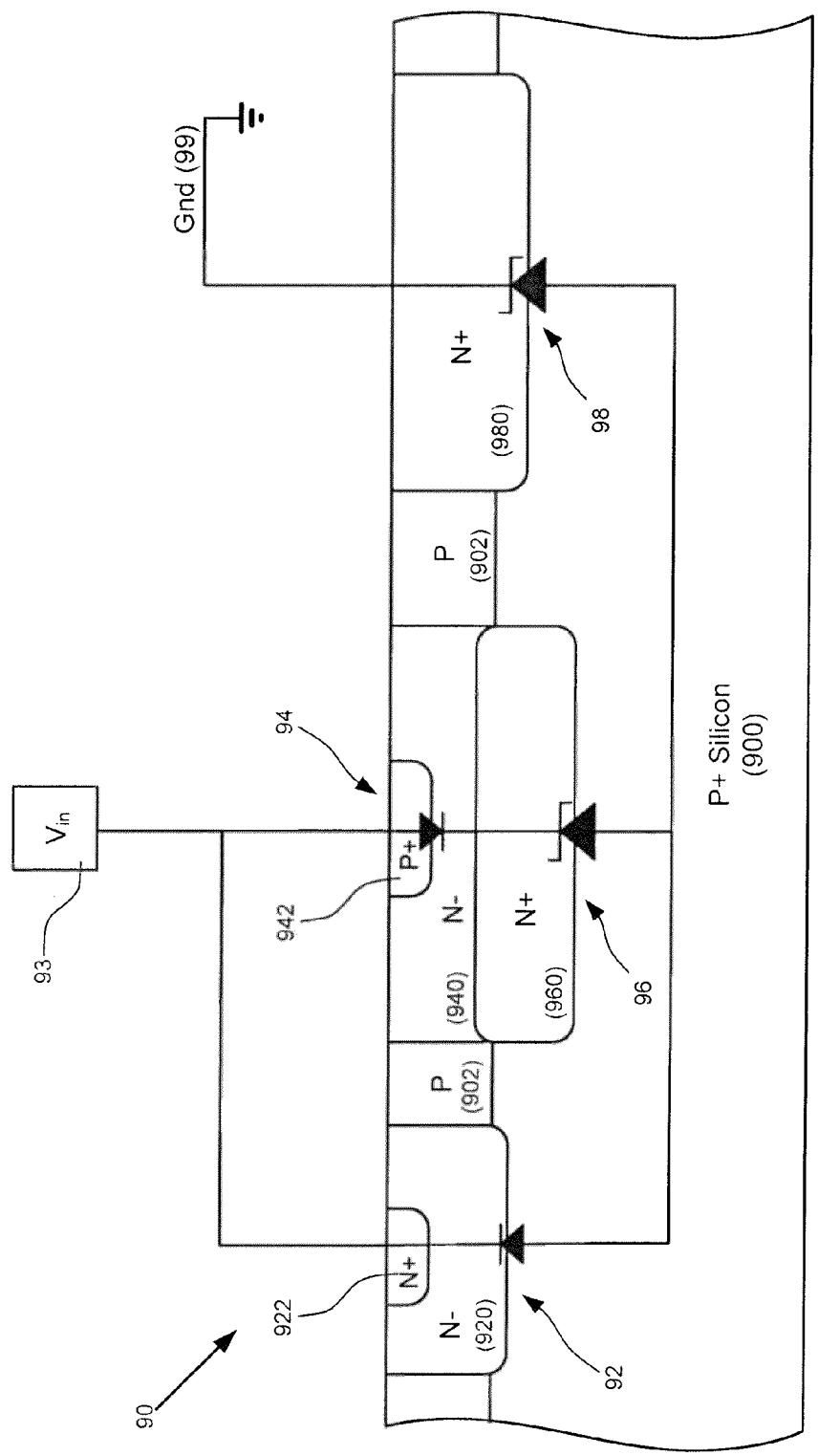
FIG. 9 shows the general structure of semiconductor integrated circuits which include a circuit according to certain aspects of the invention.

Turning to FIG. 9, an implementation of one channel of FIG. 3 is depicted. Steering diode 92 is formed at the junction of an N− well 920 and a P+ silicon substrate 900. Steering diode 94 is formed at the junction of a P+ region 942 provided in an N− region 940. N− region 940 is formed over an N+ well 960. Anode of steering diode 94 is connected to cathode of steering diode 92 and input signal 93. Two Zener diodes 96 and 98 are provided at the junction of the P+ substrate 900 and N+ regions 960 and 980 (respectively). Thus, Zener 98 provides a discharge path between substrate 900 and signal ground 99. Cathode 940 of diode 94 is coupled with cathode 960 of Zener 96, thereby forming rail 302 or 304 of FIG. 3. P+ substrate 900 connects and serves as cathodes for Zener diodes 96 and 98 as well as for steering diode 92.

Figure 10:
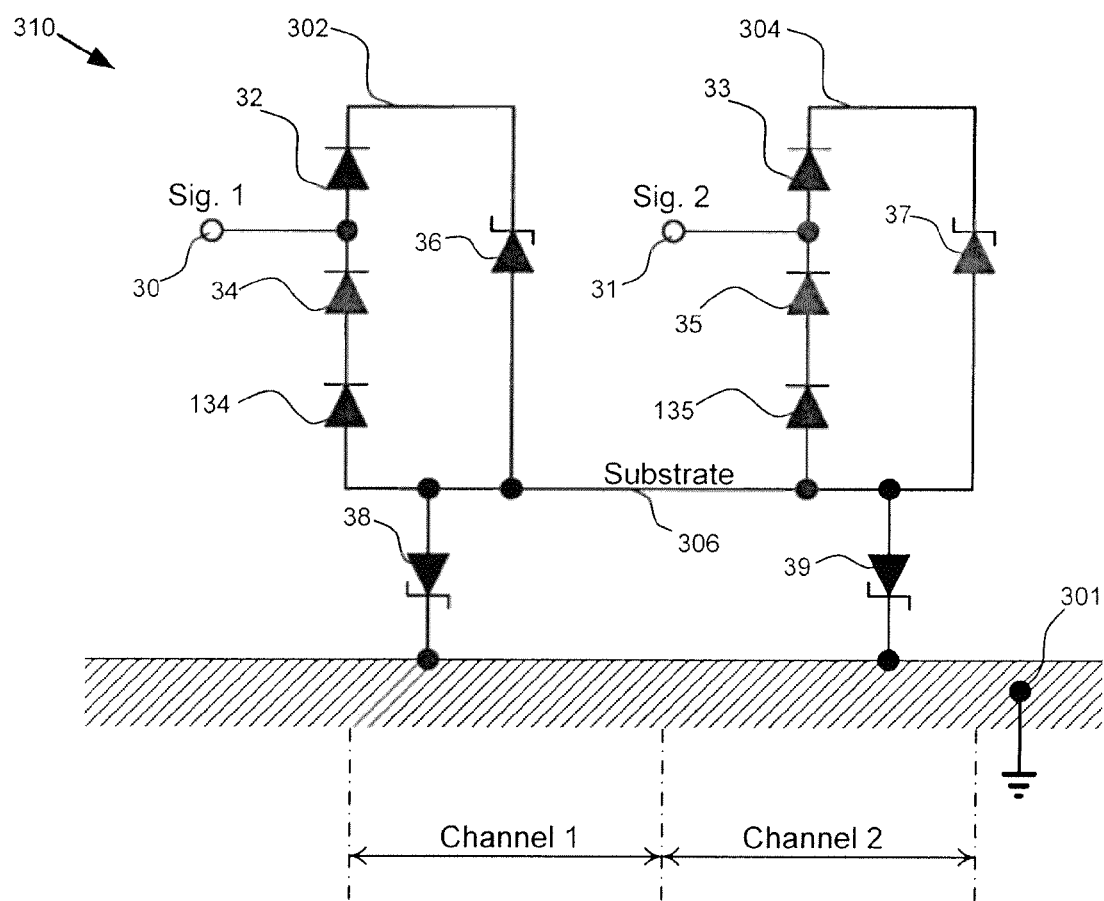
FIG. 10 is a schematic drawing of an embodiment of the present invention that includes additional components to obtain improved symmetry of response to ESD events.

FIG. 10 shows an embodiment that augments the circuit 300 of FIG. 3 with diodes 134 and 135 to obtain a more symmetric response characteristic for the channels of circuit 310. In channel 1 of both FIG. 3 and FIG. 10, an input signal observed at port 30, which has a positive polarity, causes breakdown of bypass Zener 36 when its voltage exceeds a voltage ($V_{pos}$) that can be represented as:

$$V_{pos} = V_{Fsteer} + V_{BRK\_bypass} + V_{F\_substrate}$$

where $V_{pos}$ represents positive limit voltage of the input signal, $V_{Fsteer}$ represents the forward voltage of steering diode 32 (as well as diodes 34 and 134), $V_{BRK\_bypass}$ represents the breakdown voltage of bypass Zener 36 and $V_{F\_substrate}$ represents the forward voltage of substrate Zener diode 38. For a negative polarity input signal observed at port 30 of FIG. 3, breakdown of bypass Zener 36 is caused when its voltage exceeds a voltage ($V_{neg}$) as follows:

$$V_{neg} = V_{Fsteer} + V_{BRK\_substrate}$$

where $V_{BRK\_substrate}$ represents the breakdown voltage of substrate Zener 38. Assuming that the steering diodes are similarly constructed and that the Zener diodes are similarly fabricated (see FIGS. 8A and 8B), the magnitude of voltage that causes breakdown is greater for positive polarities than for negative polarities by approximately the forward voltage of a Zener diode. Thus, adding steering diode 134 in the circuit 310 of FIG. 10 increases the magnitude of $V_{neg}$ (i.e. $V_{neg} = 2V_{Fsteer} + V_{BRK\_substrate}$), thereby providing a more symmetrical response of circuit 310.

ADDITIONAL DESCRIPTIONS OF CERTAIN ASPECTS OF THE INVENTION

The foregoing descriptions of the invention are intended to be illustrative and not limiting. For example, those skilled in the art will appreciate that the invention can be practiced with various combinations of the functionalities and capabilities described above, and can include fewer or additional components than described above. Certain additional aspects and features of the invention are further set forth below, and can be obtained using the functionalities and components described in more detail above, as will be appreciated by those skilled in the art after being taught by the present disclosure.

Certain embodiments of the invention provide semiconductor device having an electrostatic discharge (ESD) protection circuit. In some embodiments, the device is provided as an integrated circuit. In some of these embodiments, the integrated circuit comprises a plurality of reverse-biased steering diodes connected in series between a rail and a substrate of the integrated circuit. In some of these embodiments, the plurality of reverse-biased steering diodes includes two diodes connected to one another at an input port that receives an input signal. In some of these embodiments, the integrated circuit comprises a bypass Zener diode connected between the rail and the substrate. In some of these embodiments, the bypass Zener diode is reverse-biased and provides a high impedance path between the rail and the substrate when the input signal has a first polarity relative to a signal ground and a magnitude that is less than a first predetermined voltage level. In some of these embodiments, the bypass Zener diode is in breakdown and provides a low impedance path between the rail and the substrate when the input signal has the first polarity and exceeds the first predetermined voltage level. In some of these embodiments, the integrated circuit comprises a substrate Zener diode connected between the signal ground and the substrate. In some of these embodiments, the substrate Zener diode is forward-biased when the bypass Zener diode is in breakdown. In some of these embodiments, the substrate Zener diode is reverse-biased and provides a high impedance path between the signal ground and the substrate when the input signal has a second polarity relative to the signal ground and a magnitude that is less than a second predetermined voltage level. In some of these embodiments, the substrate Zener diode is in breakdown and provides a low impedance path between the signal ground and the substrate when the input signal has the second polarity and exceeds the second predetermined level.

In some of these embodiments, the second polarity is opposite the first polarity and the ESD protection circuit provides ESD protection to one or more devices connected to the input signal. In some of these embodiments, the low impedance paths provided by the substrate and bypass Zener diodes have an impedance of less than 1 ohm. In some of these embodiments, the ESD protection circuit has a substantially symmetric current-voltage characteristic relative to the signal ground. In some of these embodiments, the plurality of reverse-biased steering diodes includes a third diode connected between the input port and the signal ground wherein the third diode is provided to obtain symmetry of the current-voltage characteristic. In some of these embodiments, the bypass and substrate Zener diodes are fabricated by diffusing an N+ doped well into a P+ doped region of the substrate. In some of these embodiments, the bypass and substrate Zener diodes are fabricated in the same N+ doped well. In some of these embodiments, the junction of at least one of the plurality of steering diodes is defined by the interface of an N− well provided within the substrate. In some of these embodiments, the junction of at least one of the plurality of steering diodes is defined by the interface of a P+ well with an N− region, the N− region comprising a well provided within the substrate.

In some of these embodiments, the semiconductor device comprises a plurality of ESD protection circuits, each of the plurality of ESD protection circuits having a rail that is electrically isolated from the rail of the other ESD protection circuits, thereby reducing crosstalk between the ESD protection circuits. In some of these embodiments, a plurality of separate and distinct substrate portions is defined within the substrate of the integrated circuit. In some of these embodiments, each pair of substrate portions being electrically connected by an impedance that reduces crosstalk between each pair of the substrate portions. In some of these embodiments, the substrate and bypass Zeners of each of the plurality of ESD protection circuits are coupled to the signal ground through one of the substrate portions. In some of these embodiments, electrical isolation is obtained by providing a trench in the substrate of the semiconductor device. In some of these embodiments, electrical isolation is obtained by connecting the substrate portions using an inductance. In some of these embodiments, the integrated circuit further includes a capacitance in parallel to the substrate Zener.

Certain embodiments of the invention provide methods for fabricating a semiconductor electrostatic discharge protection circuit using conventional semiconductor processes. Some of these embodiments comprise providing a P-type semiconductor substrate. Some of these embodiments comprise forming two Zener cathode regions having an N-type dopant concentration. In some of these embodiments, each Zener cathode region is formed within a Zener anode region that has a P-type dopant concentration higher than the dopant concentration of substrate adjacent to the Zener anode region. Some of these embodiments comprise providing a first steering diode by forming a first N-type well in the substrate. Some of these embodiments comprise providing a second steering diode by forming a second N-type well in the substrate, and subsequently forming a P-type well within the second N-type well. Some of these embodiments comprise connecting the first N-type well and the P-type well to an input port. Some of these embodiments comprise connecting the second N-type well to a first one of the Zener cathode regions. Some of these embodiments comprise connecting another of the Zener cathode regions to a signal ground.

In some of these embodiments, each Zener cathode region is formed within a Zener anode region that has a P-type dopant concentration higher than the dopant concentration of substrate adjacent to the Zener anode region. In some of these embodiments, the two Zener cathode regions are formed within the same Zener anode region. In some of these embodiments, the second N-type well is formed from a portion of the first Zener cathode region. In some of these embodiments, the second N-type well has a dopant concentration that is lower than the dopant concentration of the first Zener cathode region. In some of these embodiments, the substrate comprises an epitaxial layer having a doping concentration that is lower than the doping concentration of the substrate. In some of these embodiments, each of the Zener anode region and the first and second N– wells are formed within the epitaxial layer.

Certain embodiments of the invention provide a multichannel electrostatic discharge (ESD) protection device. In some of these embodiments, the ESD protection device comprises a plurality of channels. Some of these embodiments comprise an integrated circuit having an input port that receives an input signal to be protected by the ESD device, and a plurality of diodes fabricated on a semiconductor substrate. In some of these embodiments, the plurality of diodes includes a bypass Zener diode, a substrate Zener diode and a pair of series-connected reverse-biased steering diodes. In some of these embodiments, the cathodes of the bypass Zener diode and a first of the pair of steering diodes are connected together. In some of these embodiments, the anode of the bypass Zener diode, the anode of the substrate Zener diode and the anode of the second of the pair of steering diodes are electrically connected to the substrate. In some of these embodiments, the input port is coupled to a point electrically connecting the anode of the first steering diode and the cathode of the second steering diode. In some of these embodiments, the cathode of the substrate Zener diode is coupled with a signal ground.

Although the present invention has been described with reference to specific exemplary embodiments, it will be evident to one of ordinary skill in the art that various modifications and changes may be made to these embodiments without departing from the broader spirit and scope of the invention. Accordingly, the specification and drawings are to be regarded in an illustrative rather than a restrictive sense.

What is claimed is:

1. A semiconductor device having an electrostatic discharge (ESD) protection circuit comprising an integrated circuit, the integrated circuit including:
   a plurality of reverse-biased steering diodes connected in series between a rail and a substrate of the integrated circuit, wherein the plurality of reverse-biased steering diodes includes two diodes connected to one another at an input port that receives an input signal;
   a bypass Zener diode connected between the rail and the substrate wherein
      the bypass Zener diode is reverse-biased and provides a high impedance path between the rail and the substrate when the input signal has a first polarity relative to a signal ground and a magnitude that is less than a first predetermined voltage level, and
      the bypass Zener diode is in breakdown and provides a low impedance path between the rail and the substrate when the input signal has the first polarity and a magnitude that exceeds the first predetermined voltage level; and
   a substrate Zener diode connected between the signal ground and the substrate wherein
      the substrate Zener diode is forward-biased when the bypass Zener diode is in breakdown,
      the substrate Zener diode is reverse-biased and provides a high impedance path between the signal ground and the substrate when the input signal has a second polarity relative to the signal ground and a magnitude that is less than a second predetermined voltage level, and
      the substrate Zener diode is in breakdown and provides a low impedance path between the signal ground and the substrate when the input signal has the second polarity and a magnitude that exceeds the second predetermined level;
   wherein the second polarity is opposite the first polarity and the ESD protection circuit provides ESD protection to one or more devices connected to the input signal.

2. The semiconductor device of claim 1, wherein the low impedance paths provided by the substrate and bypass Zener diodes have an impedance of less than 1 ohm.

3. The semiconductor device of claim 1, wherein the ESD protection circuit has a substantially symmetric current-voltage characteristic relative to the signal ground.

4. The semiconductor device of claim 3, wherein the plurality of reverse-biased steering diodes includes a third diode connected between the input port and the signal ground.

5. The semiconductor device of claim 1, wherein the bypass and substrate Zener diodes are fabricated by diffusing an N+ doped well into a P+ doped region of the substrate.

6. The semiconductor device of claim 5, wherein the bypass and substrate Zener diodes are fabricated within the same N+ doped well.

7. The semiconductor device of claim 5, wherein the junction of at least one of the plurality of steering diodes is defined by the interface of an N– well provided within the substrate.

8. The semiconductor device of claim 5, wherein the junction of at least one of the plurality of steering diodes is defined by the interface of a P+ well with an N– region, the N– region comprising a well provided within a P-type substrate.

9. The semiconductor device of claim 1, wherein the semiconductor device comprises a plurality of ESD protection circuits, each of the plurality of ESD protection circuits having a rail that is electrically isolated from the rail of the other ESD protection circuits, whereby the electrical isolation of the rails reduces crosstalk between the plurality of ESD protection circuits.

10. The semiconductor device of claim 1, wherein a plurality of distinct substrate portions is defined within the substrate of the integrated circuit, each pair of substrate portions being electrically isolated from one another by an impedance that reduces crosstalk between the each pair, and wherein the substrate and bypass Zeners of each of the plurality of ESD protection circuits are coupled to the signal ground through one of the substrate portions.

11. The semiconductor device of claim 10, wherein electrical isolation is obtained by providing a trench in the substrate of the semiconductor device.

12. The semiconductor device of claim 10, wherein electrical isolation is obtained by connecting the substrate portions using an inductance.

13. The semiconductor device of claim 1, wherein the integrated circuit further includes a capacitance in parallel to the substrate Zener.

14. A method for fabricating, by conventional semiconductor process, a semiconductor electrostatic discharge protection circuit, the method comprising the steps of:
providing a P-type semiconductor substrate;
forming two Zener cathode regions having an N-type dopant concentration, wherein each Zener cathode region is formed within a Zener anode region that has a P-type dopant concentration higher than the dopant concentration of the substrate adjacent to the Zener anode region;
providing a first steering diode by forming a first N-type well in the substrate;
providing a second steering diode by forming a second N-type well in the substrate, and subsequently forming a P-type well within the second N-type well;
connecting the first N-type well and the P-type well to an input port;
connecting the second N-type well to a first one of the Zener cathode regions; and
connecting another of the Zener cathode regions to a signal ground.

15. The method of claim 14, wherein the two Zener cathode regions are formed within the same Zener anode region.

16. The method of claim 15, wherein the substrate comprises an epitaxial layer having a doping concentration that is lower than the doping concentration of the substrate and wherein the Zener anode region and the first and second N− wells are formed within the epitaxial layer.

17. The method of claim 14, wherein the second N-type well is formed from a portion of the first Zener cathode region.

18. The method of claim 17, wherein the second N-type well has a dopant concentration that is lower than the dopant concentration of the first Zener cathode region.

19. A multi-channel electrostatic discharge (ESD) protection device, each of a plurality of channels of the ESD protection device comprising an integrated circuit having
an input port that receives an input signal to be protected by the ESD device, and
a plurality of diodes fabricated on a semiconductor substrate, the plurality of diodes including a bypass Zener diode, a substrate Zener diode and a pair of series-connected reverse-biased steering diodes, wherein:
the cathodes of the bypass Zener diode and a first of the pair of steering diodes are connected together;
the anode of the bypass Zener diode, the anode of the substrate Zener diode and the anode of the second of the pair of steering diodes are electrically connected to the substrate;
the input port is coupled to a point electrically connecting the anode of the first steering diode and the cathode of the second steering diode; and
the cathode of the substrate Zener diode is coupled with a signal ground.

* * * * *